(12) United States Patent
Sambamurthy et al.

(10) Patent No.: US 9,372,499 B2
(45) Date of Patent: Jun. 21, 2016

(54) LOW INSERTION DELAY CLOCK DOUBLER AND INTEGRATED CIRCUIT CLOCK DISTRIBUTION SYSTEM USING SAME

(71) Applicant: Advanced Micro Devices, Inc., Sunnyvale, CA (US)

(72) Inventors: Sriram Sambamurthy, Austin, TX (US); Arun Sundaresan Iyer, Bangalore (IN); Alok Baluni, Bangalore (IN); Aaron Grenat, Austin, TX (US)

( * ) Notice: Subject to any disclaimer, the term of this patent is extended or adjusted under 35 U.S.C. 154(b) by 142 days.

(21) Appl. No.: 14/159,967

(22) Filed: Jan. 21, 2014

(65) Prior Publication Data

US 2015/0205323 A1 Jul. 23, 2015

(51) Int. Cl.
*H03B 19/00* (2006.01)
*G06F 1/04* (2006.01)
*H03K 19/20* (2006.01)
*H03K 5/00* (2006.01)
*H03K 19/00* (2006.01)

(52) U.S. Cl.
CPC .............. *G06F 1/04* (2013.01); *H03K 5/00006* (2013.01); *H03K 19/0013* (2013.01); *H03K 19/20* (2013.01)

(58) Field of Classification Search
CPC .............. G06G 1/1632; H03K 3/0315; H04M 1/72527
See application file for complete search history.

(56) References Cited

U.S. PATENT DOCUMENTS

| 5,790,841 | A | 8/1998 | Scherer et al. |
|---|---|---|---|
| 5,923,621 | A | 7/1999 | Kanekal et al. |
| 7,061,285 | B2 | 6/2006 | Woods |
| 7,075,853 | B2 | 7/2006 | Jeong et al. |
| 2005/0140403 | A1* | 6/2005 | Lee ................... H03K 5/00006 327/122 |
| 2006/0163572 | A1* | 7/2006 | Jeong ............... G11C 29/12015 257/48 |

* cited by examiner

*Primary Examiner* — Sibin Chen
(74) *Attorney, Agent, or Firm* — Polansky & Associates P.L.L.C.; Paul J. Polansky

(57) ABSTRACT

A clock doubler includes a first NAND gate having a first input for receiving a clock input signal and a second input, a second NAND gate having a first input and a second input for receiving a complement of the clock input signal, an output NAND gate having a first and second inputs coupled to outputs of the first and second NAND gates, respectively, and an output for providing a clock output signal, an inverter chain having an input for receiving the clock input signal and responsive to first and second control signals to selectively provide a first true output to the first input of the second NAND gate, and a second complementary output to the second input of the first NAND gate, and a control signal generation circuit providing the first and second control signals in response to the outputs of the first and second NAND gates.

19 Claims, 5 Drawing Sheets

700

800

900

LOW INSERTION DELAY CLOCK DOUBLER AND INTEGRATED CIRCUIT CLOCK DISTRIBUTION SYSTEM USING SAME

FIELD

This disclosure relates generally to clock circuits, and more specifically to clock circuits for uses such as integrated circuit clock trees.

BACKGROUND

Modern microprocessors are complex logic circuits that contain many millions of transistors integrated onto a small semiconductor chip. Microprocessors operate in synchronism with a clock signal. They typically include a phase locked loop (PLL) to increase the frequency of an input clock signal to higher operating frequencies. The higher frequency clock signal is distributed to various circuit blocks such as caches, instruction decoders, register files, arithmetic logic units, and the like in a hierarchy known as a "clock tree". The clock tree has a main trunk from the PLL, major branches that are routed in different directions on the chip, and sub-branches until the clock signals reach the actual circuitry. The clock tree typically re-buffers the clock signals at each branch and sub-branch.

Dynamic power in clocked complementary metal-oxide-semiconductor (CMOS) circuits is a function of the dynamic capacitance and both the frequency of operation and the square of the voltage, according to the formula $P=CV^2f$. The required voltage in turn is related to the frequency of operation; at faster speeds, higher voltages are required for proper operation. Conversely operation at lower speeds reduces power consumption by both reducing the frequency and reducing the required voltage.

Although modern, deep sub-micron CMOS semiconductor manufacturing technologies have allowed microprocessor chips to remain relatively small, the clock signals must be distributed widely around the chip. The signal lines that carry the clock signals have large capacitances because of the distances involved, and therefore they consume a significant portion of the chip's power budget. For example, the clock distribution network may account for about 10% or more of the overall chip power budget.

Because of the high power consumption of the clock tree, some engineers have devised clock trees whose PLLs output the main clock signal at half of the desired operating frequency. The clock tree distributes the half-speed clock signal to save power. Then a set of local clock doublers increase the frequency of the half-speed clock signal at the branches or leaves of the tree back to the desired operating frequency. Unfortunately, known clock doublers have problems themselves, including high power consumption and the inability to provide a symmetrical 50% duty cycle. The drawbacks of known clock doublers have reduced the advantage of using this clock distribution technique.

Figure 1:
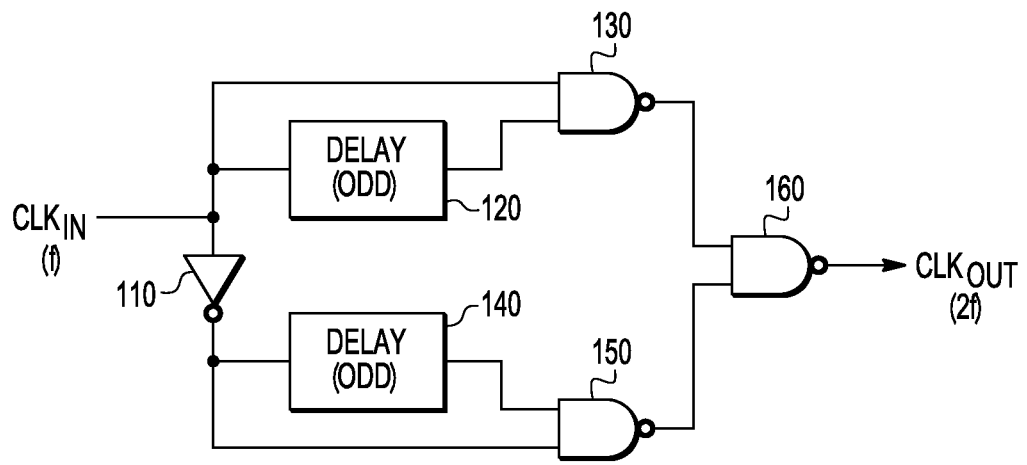
FIG. 1 illustrates in block diagram form a first clock doubler known in the prior art.

In the following description, the use of the same reference numerals in different drawings indicates similar or identical items. Unless otherwise noted, the word "coupled" and its associated verb forms include both direct connection and indirect electrical connection by means known in the art, and unless otherwise noted any description of direct connection implies alternate embodiments using suitable forms of indirect electrical connection as well.

DETAILED DESCRIPTION OF ILLUSTRATIVE EMBODIMENTS

In one form, a clock doubler includes first and second NAND gates, an output NAND gate, an inverter chain, and a clock signal generation circuit. The first NAND gate has a first input for receiving a clock input signal, a second input, and an output. The second NAND gate has a first input, a second input for receiving a complement of the clock input signal, and an output. The output NAND gate has a first input coupled to the output of the first NAND gate, a second input coupled to the outputs of the second NAND gate, and an output for providing a clock output signal. The inverter chain has an input for receiving the clock input signal and is responsive to first and second control signals to selectively provide a first true output to the first input of the second NAND gate, and a second complementary output to the second input of the first NAND gate. The control signal generation circuit provides the first and second control signals in response to the outputs of the first and second NAND gates.

In some embodiments, such a clock doubler may be used in a half-clock distribution system. The clock distribution system may include a phase locked loop having an input for receiving an external clock signal and an output for providing the clock input signal, and a plurality of clock sub-domains each receiving the clock input signal, in which each of the plurality of clock sub-domains comprise the clock doubler.

In other embodiments, the clock doubler can be used in different circuits and operate with low power consumption and small size.

In some embodiments, a clock input signal having a first frequency is received. The clock input signal is selectively buffered during a first phase of a clock output signal to form a first state signal. The first state signal is selectively inverted during a second phase of the clock output signal to form a second state signal. A first phase clock signal is formed in response to a logical combination of the clock input signal and the second state signal. A second phase clock signal is formed in response to a logical combination the first state signal and a complement of the clock input signal. The clock output signal is provided at a second frequency twice the first frequency in response to a logical combination of the first phase clock signal and a second phase clock signal.

FIG. 1 illustrates in block diagram form a first clock doubler 100 known in the prior art. Clock doubler 100 includes an inverter 110, a delay circuit 120, a NAND gate 130, a delay circuit 140, and a NAND gate 150, and an NAND gate 160. Inverter 110 has an input for receiving a clock input signal labeled "$CLK_{IN}$", and an output. Delay circuit 120 has an input for receiving the $CLK_{IN}$ signal, and an output. NAND gate 130 has a first input for receiving the $CLK_{IN}$ signal, a second input connected to the output of delay circuit 120, and an output. Delay circuit 140 has an input for receiving the $CLK_{IN}$ signal, and an output. NAND gate 140 has a first input connected to the output of delay circuit 140, a second input for receiving the $CLK_{IN}$ signal, and an output. NAND gate 150 has a first input connected to the output of NAND gate 130, a second input connected to the output of NAND gate 150, and an output for providing a clock output signal labeled "$CLK_{OUT}$".

Clock doubler circuit 100 receives the $CLK_{IN}$ signal at a frequency f and converts it into the $CLK_{OUT}$ signal at a frequency of 2f. When $CLK_{IN}$ has been stable at a logic low, the first input of NAND gate 130 is a logic low, whereas the output of delay circuit 120, which includes an odd number of inverting stages, is a logic high. Thus the output of NAND gate 130 is at a logic high. Inverter 110 provides a logic high at its output, and delay circuit 140, which also includes an odd number of inverting stages, provides a logic low at its output, which causes NAND gate 150 to output a logic high. Since both inputs of NAND gate 160 are at a logic high, it outputs the $CLK_{OUT}$ signal at a logic low.

When $CLK_{IN}$ switches to a logic high, the inputs of NAND gate 130 are temporarily both at a logic high, and NAND gate 130 temporarily outputs a logic low. The logic low at the first input of NAND gate 160 causes its output to temporarily switch to a logic high. The output of delay circuit 140 begins at a logic low, keeping the output of NAND gate 150 at a logic high. When the logic high at the input of delay circuit 120 has propagated to the output as a logic low, the output of NAND gate 130 switches to a logic high. Meanwhile, output of delay circuit 140 is initially at a logic low. The logic low at the output of inverter 110 propagates to the output of delay circuit 140 as a logic high. However since the output of inverter 110 is a logic low, the output of NAND gate 150 remains at a logic high.

When $CLK_{IN}$ then switches to a logic low, the inputs of NAND gate 130 are temporarily both at a logic low, and NAND gate 130 outputs a logic high. The output of delay circuit 120 begins at a logic low, keeping the output of NAND gate 130 at a logic high. The logic low at the input of delay circuit 120 eventually propagates to the output as a logic high. Meanwhile, output of delay circuit 140 is initially at a logic high. The logic high at the output of inverter 110 causes NAND gate 150 to output a logic low, which causes NAND gate 160 to temporarily switch to a logic high. When the input of delay circuit 140 propagates to the output as a logic low, the output of NAND gate 150 switches to a logic high, causing the output of NAND gate 160 to switch to a logic low. Thus during each half phase of the $CLK_{IN}$ signal, the $CLK_{OUT}$ signal initially switches to a logic high before returning to a logic low, resulting in clock doubling.

However clock doubler 100 has at least two problems. First, the delay stages themselves consume significant amounts of power because the delay stages are made up of CMOS inverters that consume power every time they switch. For example, delay circuits 120 and 140 may each require 7 or 9 inverters to provide adequate delay. When combined with many other such clock doublers in a clock tree, the power savings gained from distributing the clock at half frequency are significantly offset by the increased power consumption caused by the operation of the clock doublers at the end of each branch.

Second, clock doubler 100 is typically required to drive a large load, which may reduce the logic high time and eventually cause failure of load circuits. Moreover, the load will vary throughout the integrated circuit, making it difficult to design a single clock doubler which is capable of adequately driving all loads.

Figure 2:
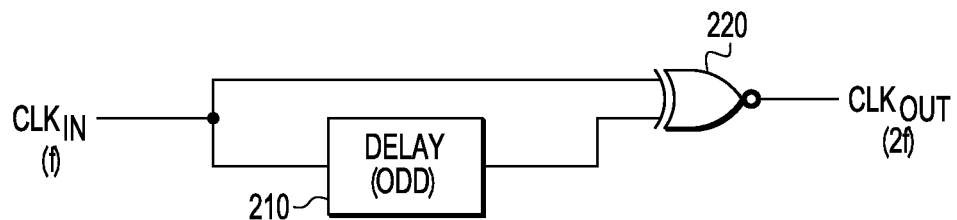
FIG. 2 illustrates in block diagram form a second clock doubler known in the prior art.

FIG. 2 illustrates in block diagram form a second clock doubler 200 known in the prior art. Clock doubler 200 includes a delay circuit 210 and an exclusive NOR gate 220. Delay circuit 210 has an input for receiving the $CLK_{IN}$ signal, and an output. Exclusive NOR gate 220 has a first input for receiving the $CLK_{IN}$ signal, a second input connected to the output of delay circuit 210, and an output for providing the $CLK_{OUT}$ signal.

Exclusive NOR gate 220 provides the $CLK_{OUT}$ signal at a logic high when both of its inputs are in the same logic state, and at a logic one when its inputs are in different logic states. Delay circuit 210 has an odd number of delay stages so that its output is in the opposite logic state as its input after the input has propagated to the output. Thus when $CLK_{IN}$ is initially in a logic low and switches to a logic high, the inputs to exclusive NOR gate 220 are initially in the same logic state (logic high), and the output of exclusive NOR gate 220 is initially at a logic low. When the logic high at the input of delay circuit 210 propagates to a logic low at the output, then the inputs to exclusive NOR gate 220 are different and exclusive NOR gate 220 outputs a logic low. When $CLK_{IN}$ switches to a logic low, the inputs to exclusive NOR gate 220 are initially in the same logic state (logic low), and the output of exclusive NOR gate 220 is initially at a logic high. When the logic low at the input of delay circuit 210 propagates to a logic high at the output, then the inputs to exclusive NOR gate 220 are different and exclusive NOR gate 220 outputs a logic low. Thus during each half phase of the $CLK_{IN}$ signal, the $CLK_{OUT}$ signal initially switches to a logic high before returning to a logic low, resulting in clock doubling.

While clock doubler 200 has reduced area and power compared to clock doubler 100 of FIG. 1, the number of inverting delay stages will be about the same. Thus clock doubler 200 continues to consume a significant amount of area and power.

Figure 3:
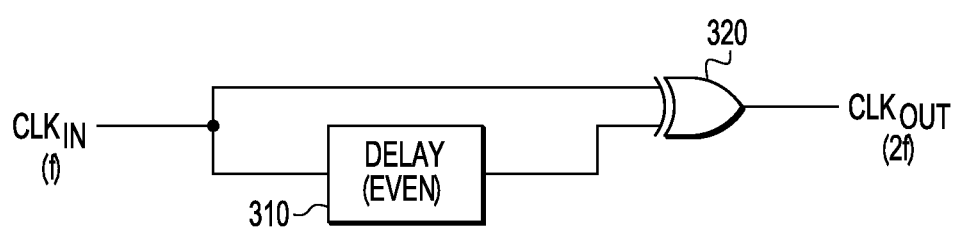
FIG. 3 illustrates in block diagram form a third clock doubler known in the prior art.

FIG. 3 illustrates in block diagram form a third clock doubler 300 known in the prior art. Clock doubler 300 includes a delay circuit 310 and an exclusive OR gate 320. Delay circuit 310 has an input for receiving the $CLK_{IN}$ signal, and an output. Exclusive OR gate 320 has a first input for receiving the $CLK_{IN}$ signal, a second input connected to the output of delay circuit 310, and an output for providing the $CLK_{OUT}$ signal.

Exclusive OR gate 320 provides the $CLK_{OUT}$ signal at a logic high when its inputs are in different logic states, and at a logic low when its inputs are in the same logic state. Delay circuit 310 has an even number of delay stages so that its output is in the same logic state as its input after the input has propagated to the output. Thus when $CLK_{IN}$ is initially in a logic low and switches to a logic high, the inputs to exclusive OR gate 320 are initially in different logic states, and the output of exclusive OR gate 320 is initially at a logic high. When the logic high at the input of delay circuit 310 propagates to a logic high at the output, then the inputs to exclusive OR gate 320 are in the same state and exclusive OR gate 320 outputs a logic low. When $CLK_{IN}$ switches to a logic low, the inputs to exclusive NOR gate 320 are initially in different logic states, and the output of exclusive OR gate 320 is initially at a logic high. When the logic low at the input of delay circuit 310 propagates to a logic low at the output, then the inputs to exclusive OR gate 320 are the same and exclusive OR gate 320 outputs a logic low. Thus during each half phase of the $CLK_{IN}$ signal, the $CLK_{OUT}$ signal initially switches to a logic high before returning to a logic low, resulting in clock doubling.

Clock doubler 300 is the analog of clock doubler 200 of FIG. 2 for exclusive OR logic. While clock doubler 300 also has reduced area and power compared to clock doubler 100 of FIG. 1, the number of inverting delay stages will be about the same. Thus clock doubler 300 (like clock doubler 200) also consumes a significant amount of area and power.

Figure 4:
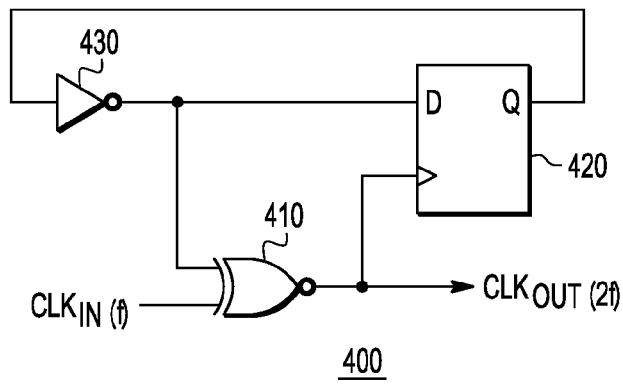
FIG. 4 illustrates in block diagram form a fourth clock doubler known in the prior art.

FIG. 4 illustrates in block diagram form a fourth clock doubler 400 known in the prior art. Clock doubler 400 includes an exclusive NOR gate 410, a D-type flip flop 420, and an inverter 430. Exclusive NOR gate 410 has a first input, a second input for receiving the $CLK_{IN}$ signal, and an output for providing the $CLK_{OUT}$ signal. D-type flip flop has a D input, a clock input connected to the output of exclusive NOR gate 410, and a Q output. Inverter 430 has an input connected to the Q output of D-type flip flop 420, and an output connected to the first input of exclusive NOR gate 410 and to the D input of D-type flip flop 420.

Since clock doubler 400 uses D-type flip-flop 420, it consumes extra power compared to NAND gates 130, 140 and 150 of clock doubler 100, exclusive NOR gate 220 of clock doubler 200, and exclusive OR gate 320 of clock doubler 300. However it also uses the clock-to-Q delay of D-type flip flop 420 as part of the delay chain, saving area and power in the respective delay chains. However the clock-to-Q delay of flip-flop 420 sets a lower limit on the delay time of the $CLK_{OUT}$ pulse, potentially providing a wider pulse than necessary when used to directly control register elements like flip-flops and latches.

Figure 5:
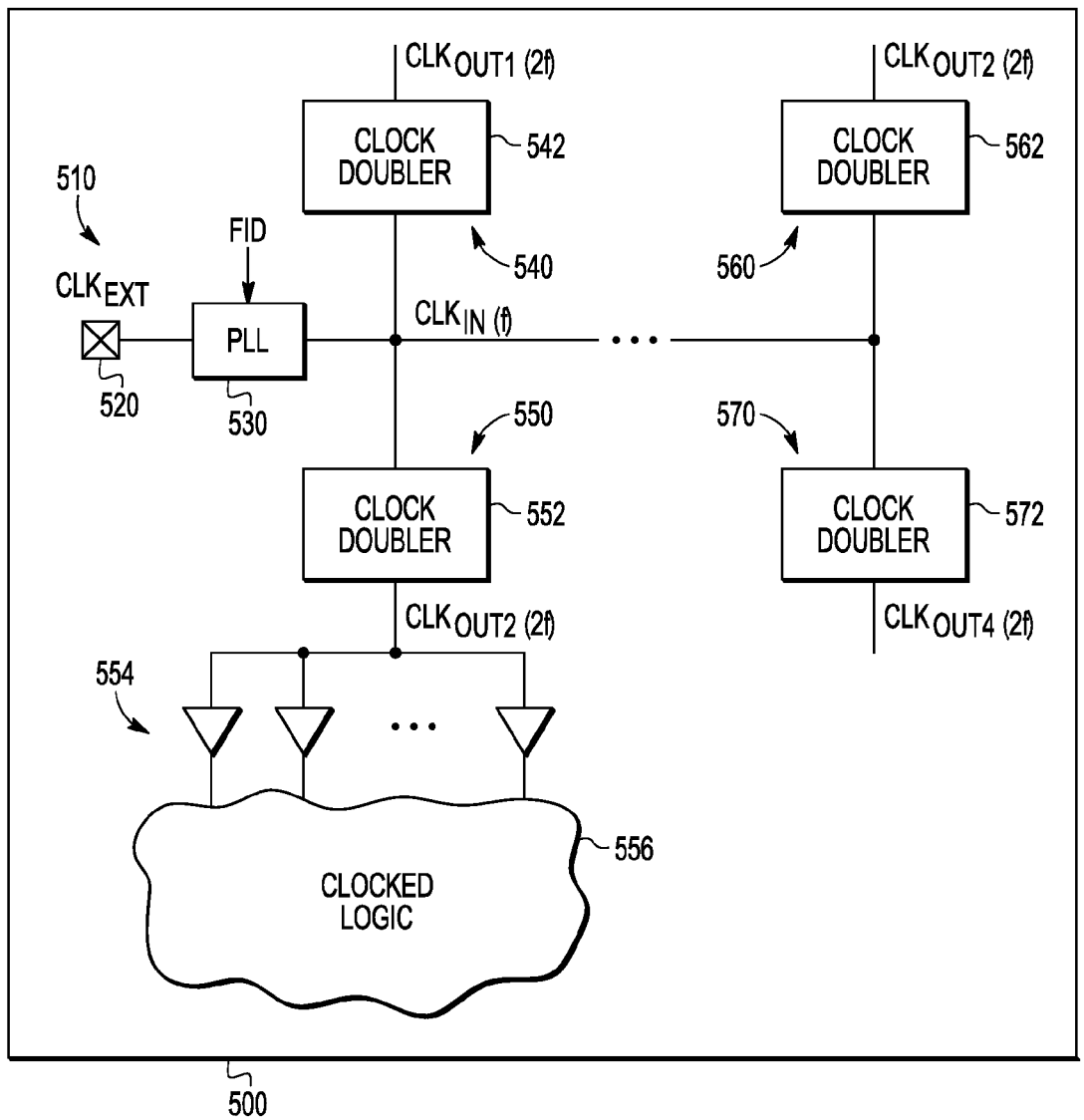
FIG. 5 illustrates in block diagram form an integrated circuit with a clock distribution system according to some embodiments.

FIG. 5 illustrates in block diagram form an integrated circuit 500 with a clock distribution system 510 according to some embodiments. Clock distribution system 510 includes a bonding pad 520, a PLL 530, and a set of clock sub-domains 540, 550, 560, and 570. Bonding pad 520 receives an external clock signal labeled "$CLK_{EXT}$". PLL 530 has an input connected to bonding pad 520, a control input for receiving a signal labeled "FID", and an output for providing the $CLK_{IN}$ signal. Clock distribution system 510 includes a number of clock sub-domains, of which a representative set 540, 550, 560, and 570 are shown in FIG. 5. Each clock sub-domain has a clock doubler having an input for receiving the $CLK_{IN}$ signal, and an output for providing a respective $CLK_{OUT}$ signal. Clock sub-domain 540 includes a clock doubler 542 having an input for receiving the $CLK_{IN}$ signal, and an output for providing a signal labeled "$CLK_{OUT2}$" for use in a further distribution to circuits in its clock sub-domain. Clock sub-domains 550, 560, and 570 each include clock doublers 552, 562, and 572, respectively, having inputs for receiving the $CLK_{IN}$ signal, and outputs for providing signals labeled "$CLK_{OUT2}$", "$CLK_{OUT3}$", and "$CLK_{OUT4}$", respectively.

FIG. 5 illustrates further details of an exemplary clock sub-domain 550. Connected to the output of clock doubler 552 is a set of buffers 554 each providing buffered $CLK_{OUT2}$ signals to different portions of clocked logic 556. Note that integrated circuit 500 may be a microprocessor or other clocked logic circuit that utilizes a clock tree with half-clock distribution to various clock sub-domains. Moreover, integrated circuit 500 may include other clock domains besides the domain associated with clock distribution system 500. For example as shown in FIG. 5, PLL 530 receives control signal FID which represents a frequency identification signal that allows the frequency of which the clock domain operates to vary. This is useful in multi-core microprocessors that allow each processor core to operates in a different power state (P-state), wherein each P-state is defined by a different frequency (indicated by FID) and voltage, and which control the P-state of each core to correspond to the processing workload.

Figure 6:
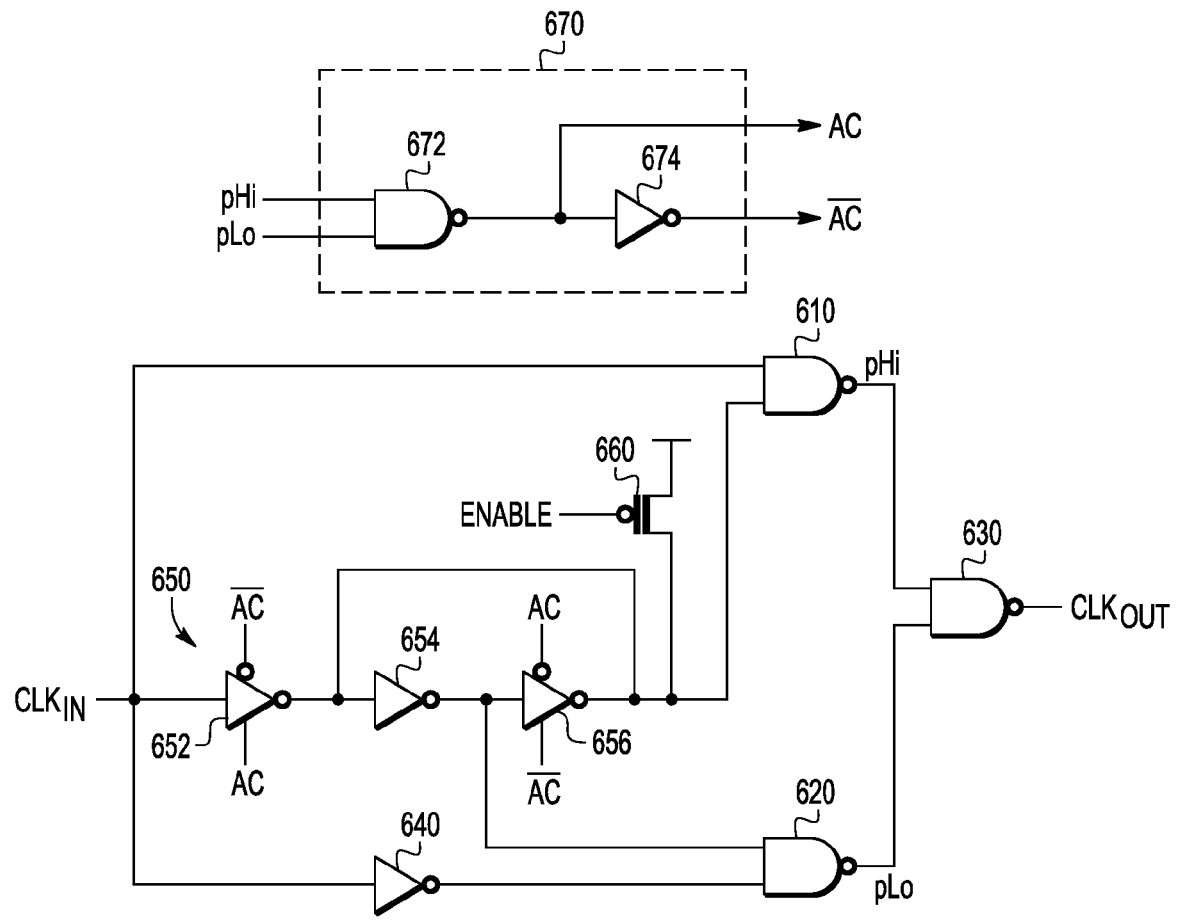
FIG. 6 illustrates in partial block diagram and partial schematic form a clock doubler suitable for use in the clock distribution system of FIG. 5 according to some embodiments.

FIG. 6 illustrates in partial block diagram and partial schematic form a clock doubler 600 suitable for use in clock distribution system 510 of FIG. 5 according to some embodiments. Clock doubler 600 includes generally NAND gates 610, 620, and 630, an inverter 640, an inverter chain 650, a P-channel MOS transistor 660, and a control signal generation circuit 670. NAND gate 610 has a first input for receiving the $CLK_{IN}$ signal, a second input, and an output for providing a signal labeled "pHi". NAND gate 620 has first and second inputs, and an output for providing a signal labeled "pLo". NAND gate 630 has a first input connected to the output of NAND gate 610, a second input connected to the output of NAND gate 620, and an output for providing the $CLK_{OUT2}$ signal. Inverter 640 has an input for receiving the $CLK_{IN}$ signal, and an output connected to the second input of NAND gate 620.

Inverter chain 650 includes a three-state inverter 652, an inverter 654, and a three-state inverter 656. Three-state inverter 652 has an input for receiving the $CLK_{IN}$ signal, a true control input for receiving an allow clock signal labeled "AC", a complement control input for receiving a complement of the allow clock signal labeled "$\overline{AC}$", and an output. Inverter 654 has an input connected to the output of three-state inverter 652, and an output connected to the first input of NAND gate 620. Three-state inverter 656 has an input connected to the output of inverter 654, a true control input for receiving signal $\overline{AC}$, a complement control input for receiving signal AC, and an output connected to the input of inverter 654 and to the second input of NAND gate 610.

Transistor 660 has a source connected to a power supply voltage terminal labeled "$V_{DD}$", a gate for receiving a signal labeled "ENABLE", and a drain connected to the second input terminal of NAND gate 610. Control signal generation circuit 670 includes a NAND gate 672 and an inverter 674. NAND gate 672 has a first input for receiving the pHi signal, a second input for receiving the pLo signal, and an output for providing signal AC. Inverter 674 has an input connected to the output of NAND gate 672, and an output for providing signal $\overline{AC}$.

When clock doubler 600 if gated off, a controller (not shown) de-activates the ENABLE signal at a logic low. Transistor 660 is conductive, forcing a logic high on the second input of NAND gate 610. The second input of NAND gate 610 forms a state node of clock doubler 600. The controller also keeps the $CLK_{IN}$ signal at a logic low, thus holding signal pHi at the output of NAND gate 610 at a logic high. The logic high at the second input of NAND gate 610 is inverted by inverter 654 to provide a logic low at the first input of NAND gate 620. The logic low forces the output of NAND gate 620 to a logic high. Since both of its inputs are logic high, NAND gate 630 provides the $CLK_{OUT2}$ signal at a logic low. Control signal generation circuit 670 provides signal AC at a logic low and signal $\overline{AC}$ at a logic high, which disables three-state inverter 652 and enabled three-state inverter 656.

When clock doubler 600 is gated on, the controller activates the ENABLE signal at a logic high, making transistor 660 non-conductive, but since three-state inverter 656 is conductive, the logic high on the state node remains. The $CLK_{IN}$ signal begins to toggle as a free-running clock at frequency f and clock doubler 600 starts to function. The first rising edge of the $CLK_{IN}$ signal causes pHi to go to a logic low since the state node is also at a logic high, which in turn causes $CLK_{OUT2}$ to go to a logic high. Signal pLo is at a logic high since the output of inverter 654 is a logic low. Control signal generation circuit 670 provides signal AC at a logic high and signal $\overline{AC}$ at a logic low, enabling three-state inverter 652 and disabling three-state inverter 656. Since transistor 660 and three-state inverter 656 are both non-conductive, three-state inverter 652 drives the state node to a logic low, which the causes signal pHi to return to a logic high and the $CLK_{OUT2}$ signal to return to a logic low. During this sequence, signal pLo remains at a logic high, causing control signal generation circuit 670 to provide signal AC at a logic low and signal $\overline{AC}$ at a logic high, disabling three-state inverter 652 and enabling three-state inverter 656, and thus maintaining signals pHi and pLo at a logic high.

The next falling edge of the $CLK_{IN}$ signal causes signal pLo to go to a logic low since the output of inverters 654 and 640 are both at a logic high, which in turn causes $CLK_{OUT2}$ to go to a logic high. Signal pHi is at a logic high since the $CLK_{IN}$ signal is a logic low. Control signal generation circuit 670 provides signal AC at a logic high and signal $\overline{AC}$ at a logic low, enabling three-state inverter 652 and disabling three-state inverter 656. Since transistor 660 and three-state inverter 656 are both non-conductive, three-state inverter 652 drives the state node to a logic high, and the output of inverter 654 to a logic low, which the causes the $CLK_{OUT2}$ signal to return to a logic low. During this sequence, pHi remains at a logic high, causing control signal generation circuit 670 to provide signal AC at a logic low and signal $\overline{AC}$ at a logic high, disabling three-state inverter 652 and enabling three-state inverter 656, thus maintaining signals pHi and pLo at a logic high.

This operation continues for every rising and falling edge of the $CLK_{IN}$ signal and causes clock doubler 600 to generate the $CLK_{OUT2}$ signal at twice the frequency of the $CLK_{IN}$ signal. Since an active high pulse is generated for every transition of $CLK_{IN}$, clock doubler 600 provides $CLK_{OUT2}$ at twice the frequency of $CLK_{IN}$. The width of the high pulse is set by the delay through control signal generation circuit 670, three-state inverter 652, and NAND gate 620 or NAND gate 630.

Since inverter chain 650 is shared for both the positive and negative phases of the delayed clock input, clock doubler 600 reduces circuit area and power consumption compared to known clock doubler circuits. Moreover the number of delay stages is reduced due to the use of NAND gates 610, 620, and 630, reducing area and power over known designs that use inverter stages. In addition, clock doubler 600 has low insertion delay, since a low-to-high transition of the $CLK_{IN}$ signal has only two levels of logic to the $CLK_{OUT2}$ signal, and a high-to-low transition of the $CLK_{IN}$ signal has only three levels of logic to the $CLK_{OUT2}$ signal. Moreover the high pulse width of the $CLK_{OUT2}$ signal can be characterized without regard to the size of the load since control signal generation circuit 670 uses internal signals pHi and pLo.

Transistor 660 operates as a keeper transistor to keep the state node at a logic high when the circuit is disabled. Given sufficient initial time, clock doubler 600 will operate properly even without transistor 660, as the state node will resolve itself over time to a stable value. However transistor 660 adds more control during the enablement phase of clock doubler 600.

Figure 7:
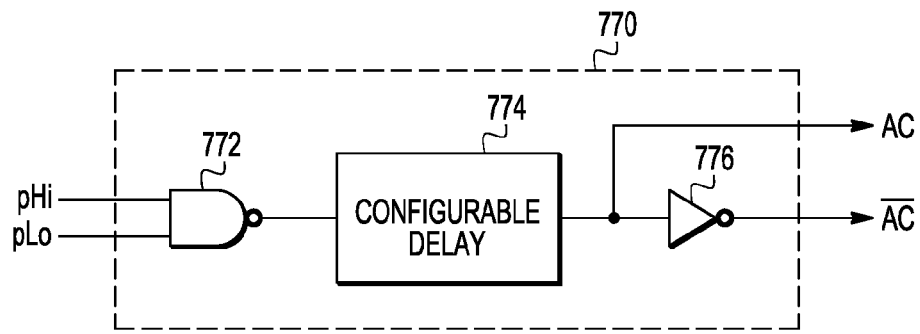
FIG. 7 illustrates in partial block diagram and partial schematic form another clock doubler suitable for use in the clock distribution system of FIG. 5 according to some embodiments.

FIG. 7 illustrates in partial block diagram and partial schematic form another clock doubler 700 suitable for use in clock distribution system 510 of FIG. 5 according to some embodiments. Clock doubler 700 is the same as clock doubler 600 of FIG. 6 except that it includes a different control signal generation circuit 770. Control signal generation circuit 770 includes a NAND gate 772, a configurable delay 774, and an inverter 776. NAND gate 772 has a first input for receiving signal pHi, a second input for receiving signal pLo, and an output. Configurable delay circuit 774 has an input connected to the output of NAND gate 772, and an output for providing signal AC. Inverter 776 has an input connected to the output of configurable delay circuit 774, and an output for providing signal $\overline{AC}$. Configurable delay circuit 774 allows the user to generate $CLK_{OUT2}$ closer to an ideal 50% duty cycle, with a tradeoff of more area and power.

Figure 8:
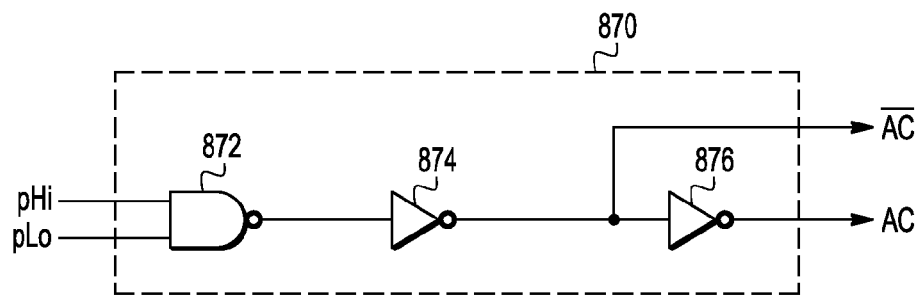
FIG. 8 illustrates in schematic form yet another clock doubler suitable for use in the clock distribution system of FIG. 5 according to some embodiments.

FIG. 8 illustrates in schematic form still another clock doubler 800 suitable for use in clock distribution system 500 of FIG. 5 according to some embodiments. Clock doubler 800 is the same as clock doubler 600 of FIG. 6 except that it includes a different control signal generation circuit 870. Control signal generation circuit 870 includes a NAND gate 872 and inverters 874 and 876. NAND gate 872 has a first input for receiving signal pHi, a second input for receiving signal pLo, and an output. Inverter 874 has an input connected to the output of NAND gate 872, and an output for providing signal $\overline{AC}$. Inverter 876 has an input connected to the output of inverter 874, and an output for providing signal AC. Clock doubler 800 allows approximately equal pulse widths on both the positive and negative phases of the $CLK_{IN}$ signal, as long as the beta ratios of inverts 874 and 876 are appropriately skewed.

Figure 9:
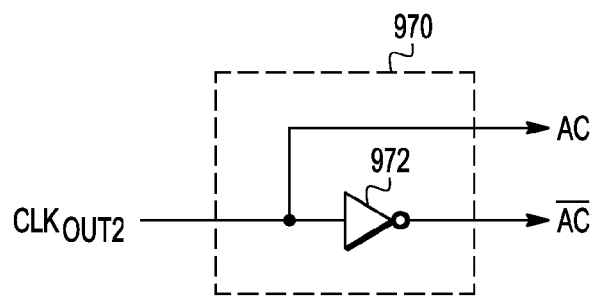
FIG. 9 illustrates in schematic form still another clock doubler suitable for use in the clock distribution system of FIG. 5 according to some embodiments.

FIG. 9 illustrates in schematic form yet another clock doubler 970 suitable for use in clock distribution system 510 of FIG. 5 according to some embodiments. Clock doubler 970 is the same as clock doubler 600 of FIG. 6 except that it includes a different control signal generation circuit 970. Control signal generation circuit 970 includes an inverter 972 having an input for receiving the $CLK_{OUT2}$ signal which it also provides as signal AC, and an output for providing signal $\overline{AC}$. Clock doubler 900 derives the AC and $\overline{AC}$ control signals from the $CLK_{OUT2}$ signal to compensate for load differences. Thus if the $CLK_{OUT2}$ signal is heavily loaded by driving multiple latches or registers or, as is shown in FIG. 5, multiple clock buffers 452, the delay contribution of the load is fed back through control signal generation circuit 970 so it can adjust its pulse width based on the load. However clock doubler 900 will typically be characterized along with the load circuit since the pulse width and feedback paths depend on the size of the load.

Figure 10:
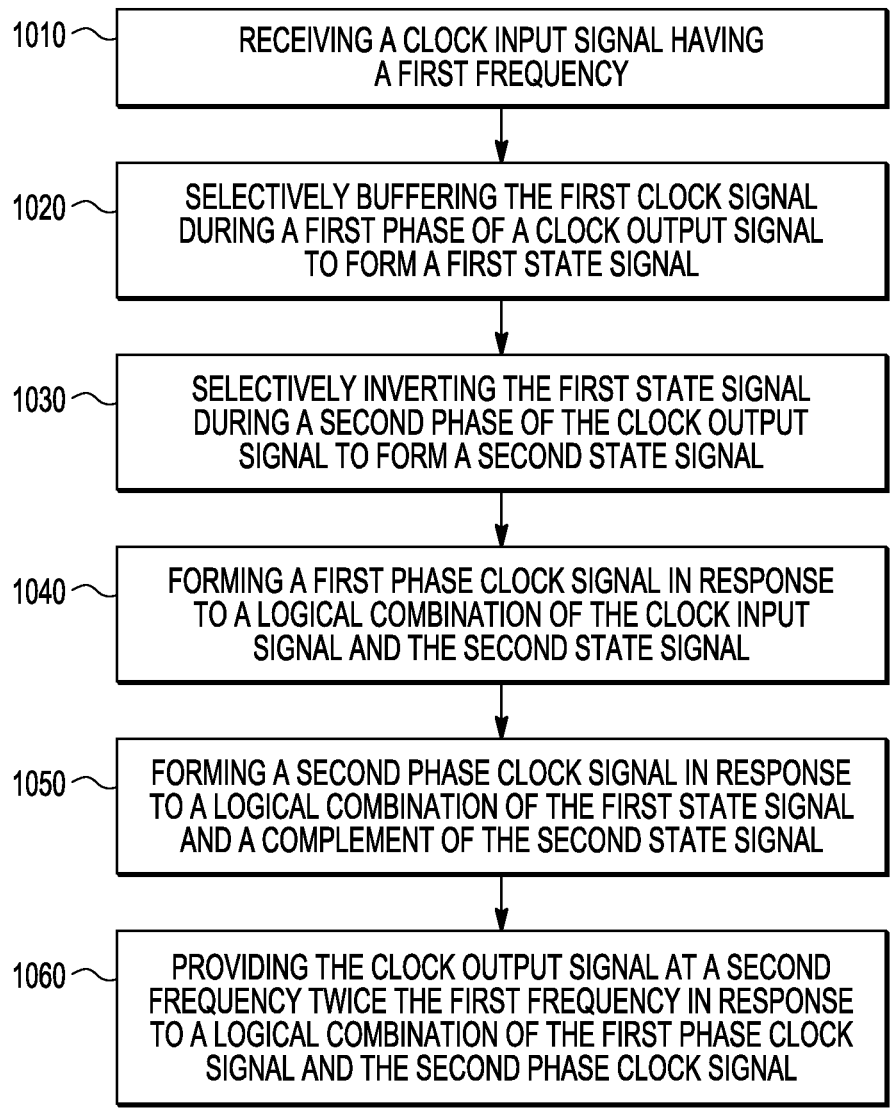
FIG. 10 illustrates a flow diagram of a method of doubling a clock signal according to some embodiments.

FIG. 10 illustrates a flow diagram of a method 1000 of doubling a clock signal according to some embodiments. Action box 1010 includes a step of receiving a clock input signal having a first frequency. Action box 1020 includes a step of selectively buffering the first clock signal during a first phase of a clock output signal to form a first state signal. Action box 1030 includes a step of selectively inverting the first state signal during a second phase of the clock output signal to form a second state signal. Action box 1040 includes a step of forming a first phase clock signal in response to a logical combination of the clock input signal and the second state signal. Action box 1050 includes a step of forming a second phase clock signal in response to a logical combination of the first state signal and a complement of the clock input signal. Action box 1060 includes a step of providing the clock output signal at a second frequency twice the first frequency in response to a logical combination of the first phase clock signal and the second phase clock signal.

The circuits of FIGS. 5-9 or portions thereof may be described or represented by a computer accessible data structure in the form of a database or other data structure which can be read by a program and used, directly or indirectly, to fabricate integrated circuits with the circuits of FIGS. 5-9. For example, this data structure may be a behavioral-level description or register-transfer level (RTL) description of the hardware functionality in a high level design language (HDL) such as Verilog or VHDL. The description may be read by a synthesis tool which may synthesize the description to produce a netlist comprising a list of gates from a synthesis library. The netlist comprises a set of gates that also represent the functionality of the hardware comprising integrated circuits with the circuits of FIGS. 5-9. The netlist may then be placed and routed to produce a data set describing geometric shapes to be applied to masks. The masks may then be used in various semiconductor fabrication steps to produce integrated circuits of FIGS. 5-9. Alternatively, the database on the computer accessible storage medium may be the netlist (with or without the synthesis library) or the data set, as desired, or Graphic Data System (GDS) II data.

While particular embodiments have been described, various modifications to these embodiments will be apparent to those skilled in the art. For example, a clock doubler circuit as described herein is suitable for a variety of applications, including microprocessors, other large clocked logic circuits, programmable gate arrays, and the like. Moreover various features or enhancements can be used in various combinations to achieve a desired clock characteristics with acceptable power and circuit area tradeoffs.

Accordingly, it is intended by the appended claims to cover all modifications of the disclosed embodiments that fall within the scope of the disclosed embodiments.

What is claimed is:

1. A clock doubler comprising:
   a first NAND gate having a first input for receiving a clock input signal, a second input, and an output;
   a second NAND gate having a first input, a second input for receiving a complement of said clock input signal, and an output, wherein the clock doubler provides a clock output signal in response to the outputs of said first and second NAND gates;
   an inverter chain having an input for receiving said clock input signal and responsive to first and second control signals to selectively provide a first true output to said first input of said second NAND gate, and a second complementary output to said second input of said first NAND gate; and
   a control signal generation circuit for providing said first and second control signals in response to said outputs of said first and second NAND gates.

2. The clock doubler of claim 1 wherein further comprising:
   an output NAND gate having a first input coupled to said output of said first NAND gate, a second input coupled to said output of said second NAND gate, and an output for providing a clock output signal.

3. The clock doubler of claim 1 wherein said inverter chain comprises:
   a first three-state inverter having an input for receiving said clock input signal, and an output, and active during a first phase of said clock output signal;
   a second inverter having an input coupled to said output of said first three-state inverter, and an output coupled to the first input of the second NAND gate; and
   a second three-state inverter having an input coupled to said output of said second inverter, and an output coupled to said input of said second inverter and to said second input of said first NAND gate, and active during a second phase of said clock output signal.

4. The clock doubler of claim 1 wherein said control signal generation circuit comprises:
   a fourth NAND gate having a first input coupled to said output of said first NAND gate, a second input coupled to said output of said second NAND gate, and an output for providing said first control signal; and
   an inverter having an input coupled to said output of said fourth NAND gate, and an output for providing said second control signal.

5. The clock doubler of claim 1 wherein said control signal generation circuit comprises:
   a fourth NAND gate having a first input coupled to said output of said first NAND gate, a second input coupled to said output of said second NAND gate, and an output for providing said first control signal; and
   a configurable delay circuit having an input coupled to said output of said fourth NAND gate, and an output for providing said first control signal; and
   an inverter having an input coupled to said output of said configurable delay circuit, and an output for providing said second control signal.

6. The clock doubler of claim 1 wherein said control signal generation circuit comprises:
   a fourth NAND gate having a first input coupled to said output of said first NAND gate, a second input coupled to said output of said second NAND gate, and an output; and
   a first inverter having an input coupled to said output of said fourth NAND gate, and an output for providing said second control signal; and
   a second inverter having an input coupled to said output of said first inverter, and an output for providing said first control signal.

7. The clock doubler of claim 1 wherein said control signal generation circuit comprises:
   an first inverter having an input for receiving said clock output signal, and an output for providing said second control signal,
   wherein said first control signal is said clock output signal.

8. The clock doubler of claim 1 further comprising:
   a transistor having a first current electrode coupled to a power supply voltage terminal, a control electrode for receiving an enable signal, and a second current electrode coupled to said second input of said first NAND gate.

9. A clock distribution system for an integrated circuit comprising:
   a phase locked loop having an input for receiving an external clock signal, and an output for providing a clock input signal;
   a plurality of clock sub-domains each receiving said clock input signal, wherein each of said plurality of clock sub-domains comprise a clock doubler having an input for receiving said clock input signal, and an output for providing a clock output signal, each clock doubler comprising:
      a first NAND gate having a first input for receiving a clock input signal, a second input, and an output;
      a second NAND gate having a first input, a second input for receiving a complement of said clock input signal, and an output, wherein each clock doubler provides a clock output signal in response to the outputs of said first and second NAND gates;
      an inverter chain having an input for receiving said clock input signal and responsive to first and second control signals to selectively provide a first true output to said first input of said second NAND gate, and a second complementary output to said second input of said first NAND gate; and a control signal generation circuit for providing said first and second control signals in response to said outputs of said first and second NAND gates.

10. The clock distribution system of claim 9 wherein each clock doubler further comprises:

an output NAND gate having a first input coupled to said output of said first NAND gate, a second input coupled to said output of said second NAND gate, and an output for providing said clock output signal.

11. The clock distribution system of claim 9 wherein said inverter chain comprises:

a first three-state inverter having an input for receiving said clock input signal, and an output, and active during a first phase of said clock output signal;

a second inverter having an input coupled to said output of said first three-state inverter, and an output coupled to the first input of the second NAND gate; and a second three-state inverter having an input coupled to said output of said second inverter, and an output coupled to said input of said second inverter and to said second input of said first NAND gate, and active during a second phase of said clock output signal.

12. The clock distribution system of claim 9 wherein said control signal generation circuit comprises:

a fourth NAND gate having a first input coupled to said output of said first NAND gate, a second input coupled to said output of said second NAND gate, and an output for providing said first control signal; and an inverter having an input coupled to said output of said fourth NAND gate, and an output for providing said second control signal.

13. The clock distribution system of claim 9 wherein said control signal generation circuit comprises:

a fourth NAND gate having a first input coupled to said output of said first NAND gate, a second input coupled to said output of said second NAND gate, and an output for providing said first control signal; and a configurable delay circuit having an input coupled to said output of said fourth NAND gate, and an output for providing said first control signal; and an inverter having an input coupled to said output of said configurable delay circuit, and an output for providing said second control signal.

14. The clock distribution system of claim 9 wherein said control signal generation circuit comprises:

a fourth NAND gate having a first input coupled to said output of said first NAND gate, a second input coupled to said output of said second NAND gate, and an output; and a first inverter having an input coupled to said output of said fourth NAND gate, and an output for providing said second control signal; and a second inverter having an input coupled to said output of said first inverter, and an output for providing said first control signal.

15. The clock distribution system of claim 9 wherein said control signal generation circuit comprises:

an first inverter having an input for receiving said clock output signal, and an output for providing said second control signal, wherein said first control signal is said clock output signal.

16. The clock distribution system of claim 9 further comprising:

a transistor having a first current electrode coupled to a power supply voltage terminal, a control electrode for receiving an enable signal, and a second current electrode coupled to said second input of said first NAND gate.

17. A method comprising:

selectively buffering a clock input signal having a first frequency during a first phase of a clock output signal to form a first state signal;

selectively inverting said first state signal during a second phase of said clock output signal to form a second state signal;

forming a first phase clock signal in response to a logical combination of said clock input signal and said second state signal;

forming a second phase clock signal in response to a logical combination said first state signal and a complement of said clock input signal; and providing said clock output signal at a second frequency twice said first frequency in response to a logical combination of said first phase clock signal and a second phase clock signal;

wherein said selectively buffering said clock input signal during said first phase of a clock output signal to form said first state signal comprises selectively buffering said clock input signal during a logic high phase of said clock output signal to form said first state signal; and wherein said selectively inverting said first state signal during said second phase of said clock output signal to form said second state signal comprises selectively inverting said first state signal during a logic low phase of said clock output signal to form said second state signal.

18. The method of claim 17 wherein:

said forming said first phase clock signal comprises forming said first phase clock signal in response to a logical NAND of said clock input signal and said second state signal;

said forming said second phase clock signal comprises forming said second phase clock signal in response to a logical NAND of said first state signal and said complement of said clock input signal; and said providing said clock output signal comprises providing said clock output signal in response to a logical NAND of said first phase clock signal and said second phase clock signal.

19. The method of claim 17 further comprising:

driving said second state signal to a voltage corresponding to a predetermined logic state in response to an enable signal.

* * * * *